United States Patent
Lee et al.

(10) Patent No.: US 8,339,288 B2
(45) Date of Patent: Dec. 25, 2012

(54) LIGHT GUIDE HAVING A CAPACITIVE SENSING GRID FOR A KEYPAD AND RELATED METHODOLOGY

(75) Inventors: Sian Tatt Lee, Klang (MY); Choon Guan Ko, Sungai Dua (MY); Fook Chuin Ng, Butterworth (MY); Muh Fong Chung, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 344 days.

(21) Appl. No.: 12/813,471

(22) Filed: Jun. 10, 2010

(65) Prior Publication Data

US 2011/0304484 A1 Dec. 15, 2011

(51) Int. Cl.
*H03K 17/94* (2006.01)
(52) U.S. Cl. ............... 341/22; 341/33; 341/34; 345/168; 345/173
(58) Field of Classification Search .................... 341/22, 341/33, 34; 178/18.06–18.07; 345/168, 345/173
See application file for complete search history.

(56) References Cited

U.S. PATENT DOCUMENTS

| | | | |
|---|---|---|---|
| 6,822,640 B2 | 11/2004 | Derocher | |
| 7,274,353 B2 | 9/2007 | Chiu et al. | |
| 7,364,339 B2* | 4/2008 | Park | 362/619 |
| 7,595,788 B2* | 9/2009 | Son | 345/168 |
| 7,825,907 B2* | 11/2010 | Choo et al. | 345/173 |
| 2002/0154250 A1 | 10/2002 | An | |
| 2009/0160682 A1 | 6/2009 | Bolender et al. | |
| 2009/0179862 A1* | 7/2009 | Strong, IV | 345/169 |
| 2009/0194344 A1 | 8/2009 | Harley et al. | |
| 2009/0250329 A1 | 10/2009 | Yu et al. | |
| 2010/0149125 A1* | 6/2010 | Klinghult et al. | 345/174 |

FOREIGN PATENT DOCUMENTS

| WO | WO2008125130 | 10/2008 |
|---|---|---|
| WO | WO2009136178 | 11/2009 |

OTHER PUBLICATIONS

"Innovate Keypad Design With Light Guides and LEDs": Avago Technologies; Nov. 17, 2009 (14 pages).

* cited by examiner

*Primary Examiner* — Khai M Nguyen
(74) *Attorney, Agent, or Firm* — Fox Rothschild LLP

(57) ABSTRACT

An electronic device may include a keypad having a plurality of predefined key areas and a light guide that may be used to illuminate the key areas. The light guide may include a capacitive sensing grid to sense user contact relative to the keypad.

20 Claims, 3 Drawing Sheets

LIGHT GUIDE HAVING A CAPACITIVE SENSING GRID FOR A KEYPAD AND RELATED METHODOLOGY

BACKGROUND

User input interfaces are used in many different types of electronic devices and generally allow human users to enter data and/or commands into an electronic format. A keypad is a type of user input interface in which one or more keys or buttons are used to enter the data and/or commands. In some keypads, the keys are movably mounted such that application of a force to a key causes the key to move relative to another portion of the keypad. Movement of the key can then be sensed electrically, for example, by causing electrical continuity to occur within a circuit. The force that moves the keys on a keypad is typically provided by the human user's finger. In other types of keypads, the keys may be stationary and user input may be sensed using, for example, either resistive or capacitive sensing technologies.

Keypads are used in many other applications, in addition to mobile telephone devices. Examples of such other applications that typically utilize keypads include electronic dictionaries, personal digital assistants (PDAs), handheld game consoles, security input pads for allowing selective entry into a facility or area and remote control devices for video and audio appliances.

A keypad may include multiple keys, each corresponding to a different command and/or data input selection. An example of a keypad with multiple keys is the type of keypad commonly used in mobile telephone devices. In a mobile telephone device, the keypad may, for example, include individual keys for each of the digits 0 through 9 to allow telephone numbers to be entered into the mobile telephone device. To help a human user interface with an electronic device via a keypad, the keys on a keypad typically include icons to identify what command or data input selection each key represents. In the example of a mobile telephone device keypad, as discussed above, the keys for each of the digits 0 through 9 may each include an appropriate icon indicating the digit that each key represents (the key that corresponds to 0 would include the icon "0", and so on). Keys often may serve different functions or data input selections when, for example, the device is in different modes of operation.

In order to facilitate use of a keypad in low ambient light situations, many keypads include a backlighting feature in which one or more light sources illuminates the keys from beneath. This backlighting generally causes each key to be lighted so that it can readily be found and identified.

To enhance optimum usability of keypad devices in low ambient light situations, it is desirable to provide keyboard backlighting that is both sufficient in intensity and relatively uniform in distribution across the illuminated keys.

SUMMARY

Disclosed herein is an electronic device that may include a housing defining an interior of the device within the housing and an exterior of the device outside of the housing. A keypad may include a first keypad surface facing the exterior of the device, an oppositely-disposed second keypad surface facing the interior of the device and a plurality of predefined user interface key areas. A light guide may be positioned adjacent the second keypad surface and is capable of backlighting the user interface key areas. The light guide may include a capacitive sensing grid capable of sensing user input relative to the keypad.

Also disclosed herein is a method including backlighting a plurality of user interface key areas in a keypad of an electronic device with a light guide and sensing user input relative to the keypad with a capacitive sensing grid formed on the light guide.

Further disclosed herein is a user input assembly for an electronic device. The user input assembly may include a keypad having a plurality of predefined user interface key areas, a substantially planar first keypad surface and a substantially planar second keypad surface that is substantially parallel to the first keypad surface. The user input assembly may further include a light guide having a capacitive sensing grid, a substantially planar first light guide surface and a substantially planar second light guide surface that is substantially parallel to the first light guide surface. The second keypad surface is substantially parallel to and adjacent the first light guide surface.

DETAILED DESCRIPTION

Figure 1:
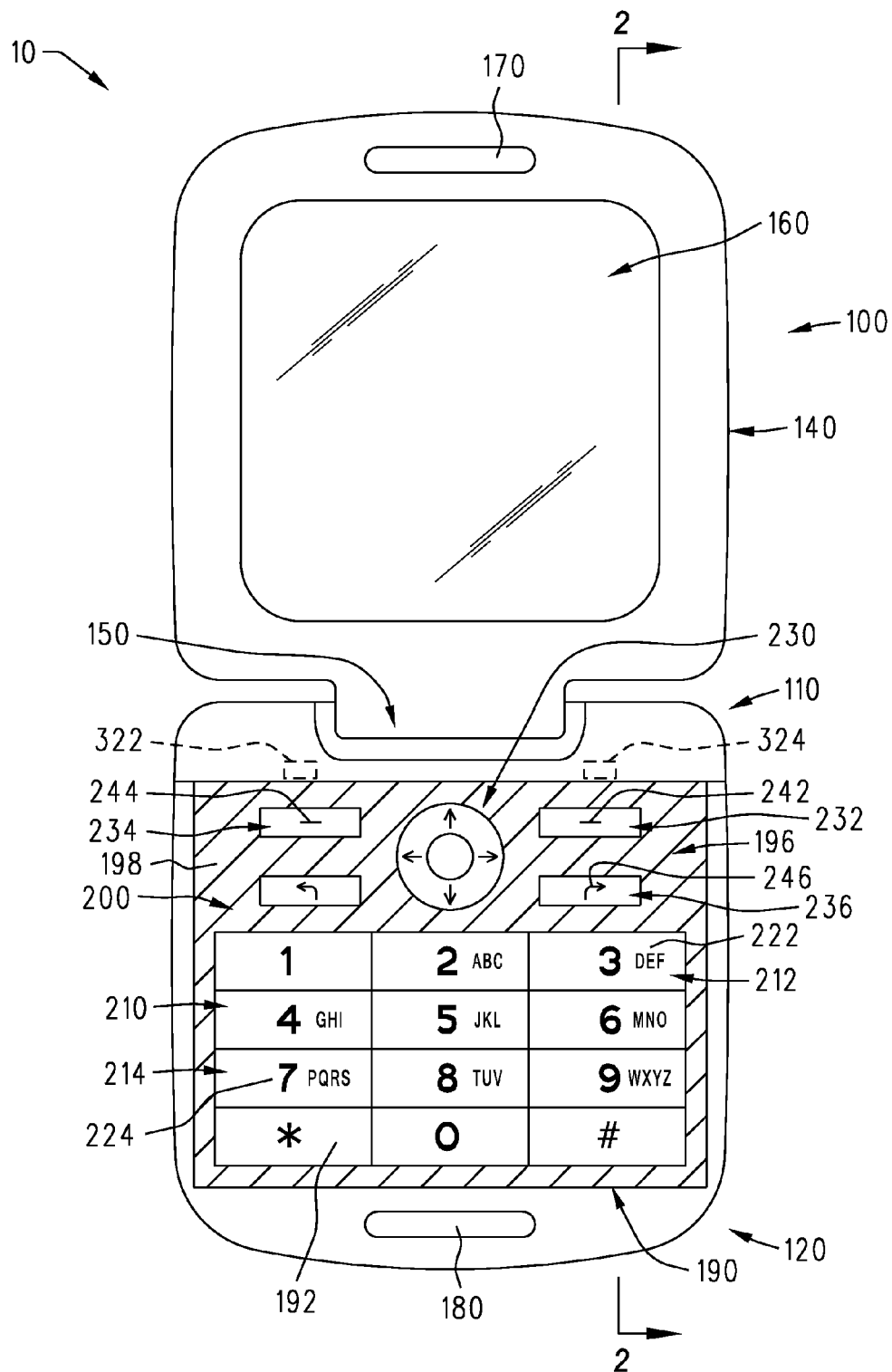
FIG. 1 is a top plan view of one exemplary embodiment of an electronic device in the form of an exemplary mobile telephone device.

FIG. 1 shows one exemplary embodiment of an electronic device 10, illustrated in the form of a mobile telephone device 100. It is to be understood that electronic device 10 is depicted in the specific form of mobile telephone device 100 for exemplary purposes only in order to facilitate the description herein of the electronic device 10. Although illustrated and described herein in the specific form of a mobile telephone device, it is to be understood that the electronic device 10 may, alternatively, be any other type of electronic device incorporating a user input device (for example, a keypad) for the purpose of allowing human users to convey data and/or commands to the electronic device in an electronic format. Examples of such other types of electronic devices include, without limitation, electronic dictionaries, personal digital assistants (PDAs), handheld game consoles, security input pads for allowing selective entry into a facility or area and remote control devices for video and audio appliances.

With further reference to FIG. 1, mobile telephone device 100 may include a body 110 including a first base portion 120 (which may also be referred to herein as a housing) and a second cover portion 140. The cover portion 140 may be pivotally attached to the base portion 120 by a hinge connection 150 in a conventional manner such that the cover portion 140 may be pivoted between a closed position, in which the cover portion 140 covers the base portion 120, and an open position (as shown in FIG. 1) in which the cover portion 140 does not cover the base portion 120. It is noted that, although mobile telephone device 100 is depicted herein as a "flip-type" phone (i.e., one that has a cover portion 140 hingedly attached to a base portion), this depiction is presented for exemplary purposes only. Mobile telephone device 100 could, alternatively be any type of telephone that includes a user input device.

As illustrated in FIG. 1, mobile telephone device 100 may include, for example, conventional features such as a display screen 160 and a speaker 170 formed on the cover portion 140. The display screen 160 may, for example, be a Liquid Crystal Display Module (LCM). The display screen 160 may, for example, be predominantly disposed inside the cover portion 140 with the display area of the display screen 160 facing outwardly from the cover portion 140 such that the display area is visible to a user when the cover portion 140 is pivoted to the open position, as illustrated in FIG. 1. The display screen 160 is provided to display, for example, images, patterns and text to the user relating to various functions (e.g., menu display and selection options and incoming call information) during normal operation of the mobile telephone device 100. The speaker 170 is provided to supply audio output to a user of the mobile telephone device 100 and is positioned such that it will be more or less adjacent to an ear of the user when the mobile telephone device 100 is being used with the cover portion 140 in the open position illustrated in FIG. 1.

Mobile telephone device 100 may further include, for example, additional features such as a microphone 180 and a keypad 190 formed in the base portion 120, as illustrated in FIG. 1. The microphone 180 is provided to acquire audio input from a user of the mobile telephone device 100 and is positioned such that it will be more or less adjacent to the mouth of the user when the mobile telephone device 100 is being used with the cover portion 140 in the open position illustrated in FIG. 1. It is noted that, although not specifically described herein, mobile telephone device 100 may also include other features and subsystems (e.g., a power supply such as a battery, various circuit boards and other electronics and one or more antennas) as will readily be understood by one of ordinary skill in the art.

Figure 2:
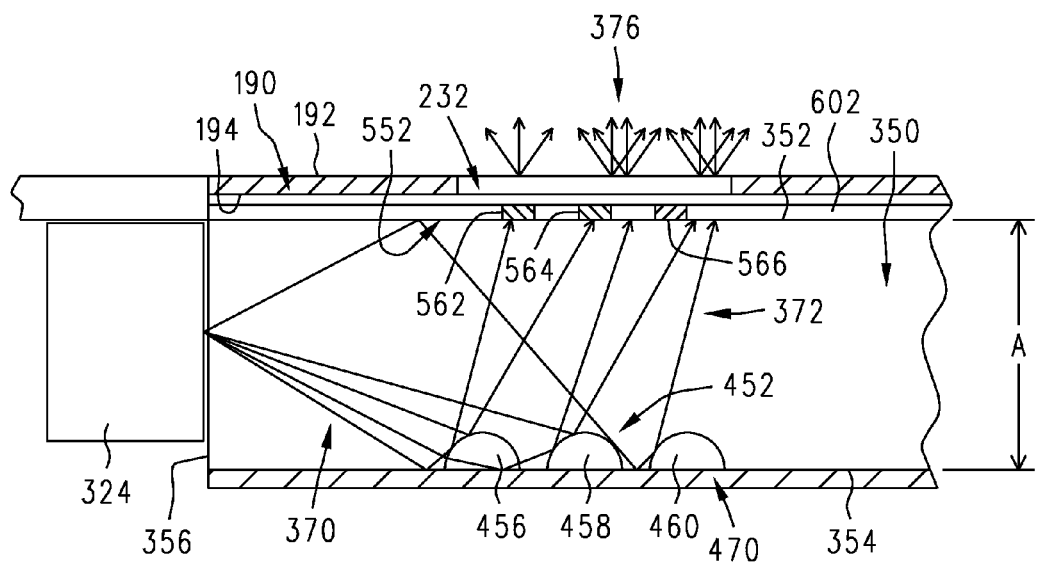
FIG. 2 is a partial cross-sectional view of the exemplary mobile telephone device of FIG. 1, taken along the line 2-2 in FIG. 1.

The keypad 190 includes an upper surface 192 that faces the user when the mobile telephone device is in the open position shown in FIG. 1 and an oppositely-disposed lower surface 194, FIG. 2, that faces the interior of the base portion 120. Lower surface 194 may, for example, have a generally white color. The keypad 190 may be formed from a light-transmissive (e.g., translucent or transparent) material. The keypad 190, however, include one or more light blocking portions, such as the light blocking portion 196 illustrated in FIG. 1. Light blocking portion 196 may be formed of a light blocking (i.e., light absorbing and/or reflecting) material and may be present in the keypad 190 in selected areas. Light blocking portion 196 may, for example, be created using light blocking fillers or pigments incorporated within the material forming the keypad 190 at the time the keypad is made. Alternatively, the light blocking portion 196 may, for example, be formed as a coating overlying the keypad 190 in the selected areas. Such a coating may, for example, be bonded to the keypad upper surface 192. According to some embodiments, such a coating may be applied to the upper surface 192, for example, by painting, vacuum coating, or ink printing. The keypad may be formed from a material such as glass or plastic having a thickness, for example, of between about 0.3 mm and about 5 mm.

In the exemplary embodiment of FIG. 1, the light-blocking portion 196 forms a decorative border 198 that substantially surrounds and defines a plurality of user interface key areas 200 where the light-blocking portion 196 is not present. The plurality of key areas 200 may include a plurality of keypad areas 210, such as the individual keypad areas 212 and 214, and a plurality of auxiliary key areas 230, such as the individual auxiliary key areas 232, 234 and 236. Each of the key areas 200 on the keypad 190 may correspond to a different command and/or data input selection. Additionally, at least some of the key areas 200 may correspond to several different functions, depending on the mode in which the keypad 190 is being used.

In order to assist the user when interfacing with the mobile telephone device 100, the key areas on the keypad 190 may include icons or symbols on their upper surfaces to identify the command(s) or data input selection(s) represented by each of the key areas 200. More specifically, the keypad areas 210 may include, for example, the icons 222, 224 in the keypad areas 212, 214, respectively. In a similar fashion, the auxiliary key areas 230 may include, for example, the icons 242, 244, 246 in the auxiliary key areas 232, 234, 236, respectively. The key area icons may, for example, be formed as part of the light blocking portion 196, discussed above. Alternatively, the icons may be formed in any conventionally-known manner, e.g., by a printing process applied to the upper surface 192 of the keypad 190 in the desired areas.

As will be explained in further detail herein, each of the key areas 200 may overlie a capacitive sensing area of a capacitive sensing system within the mobile telephone device 100, such that the presence of a user's finger or thumb on or above one of the key areas 200 can be determined, thus allowing a user to selectively enter data and/or commands during operation of the mobile telephone device 100. As will also be explained in further detail herein, in order to facilitate use of the keypad 190 in low ambient light situations, the mobile telephone device 100 may be provided with a backlighting feature in which one or more light sources (e.g., the light sources 322, 324 illustrated in FIG. 1) illuminate the key areas 200 and associated icons of the keypad 190 from beneath. This backlighting generally causes each key area icon to be lighted so that it can readily be found and actuated by the user.

With reference to FIG. 2, in order to provide for the backlighting feature discussed above, a light guide 350 may be positioned below the lower surface 194 of the keypad 190. The light guide 350 may, for example, be formed as a sheet or film of plastic material, such as PET. In general terms, the light guide may distribute light across the keypad areas 210 and the auxiliary key areas 230 from one or more light sources, for example, the light sources 322, 324, FIG. 1. The light sources may, for example, be light emitting diode (LED) light sources. Each of the light sources, for example the light source 324 shown in FIG. 2, may be positioned such that a portion of the light source overlies a side edge 356 of the light guide 350. In this manner, light from the light source can enter the light guide 350 through the side surface 356 of the light guide 350 and be distributed inside and along the light guide, as schematically indicated in FIG. 2 by the arrows 370. Portions of the distributed light may thereafter exit the light guide to provide light beneath the keypad areas 210 and the auxiliary key areas 230, as schematically illustrated by the arrows 376 in relation to the auxiliary key area 232 in FIG. 2.

Figure 3:
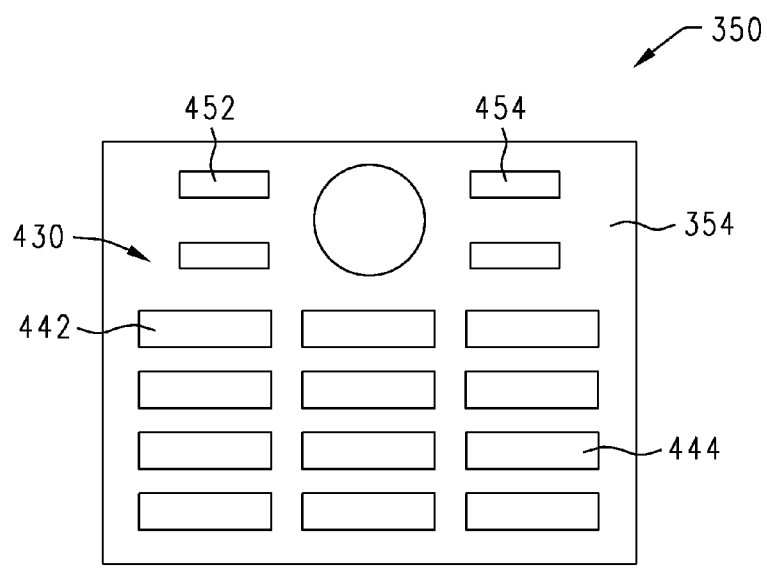
FIG. 3 is a bottom plan view of an exemplary light guide that may be used in conjunction with the exemplary mobile telephone device of FIG. 1.

With reference to FIG. 3, the lower surface 354 of the light guide 350 may generally be provided with a plurality of patterned areas 430, including the individual patterned areas 442, 444, 452 and 454, as schematically illustrated in FIG. 3. Patterned areas 430 may, for example, take the form of selectively located reflective patterns, formed at or near the lower surface 354 of the light guide, as is well-known in the art, to cause more light to leave the light guide at specific desired locations, e.g., beneath each of the keypad areas 210 and auxiliary key areas 230 of the keypad 190. With reference to FIG. 3, it can be appreciated, for example, that the individual patterned areas 442 and 444 will underlie the keypad areas 212 and 214, respectively and that the individual patterned areas 452 and 454 will underlie the auxiliary key areas 232 and 234, respectively. With reference to FIG. 2, it can be seen that the individual patterned area 452, for example, is located beneath the auxiliary key area 232. Each of the patterned areas 430 may, for example, include a plurality of hemispherical concavities extending into the light guide 350 from its lower surface 354, for example, the hemispherical concavities 456, 458 and 460 shown in conjunction with the patterned area 452 in the exemplary embodiment of FIG. 2.

With further reference to FIG. 2, it can be seen that some of the light traveling along the light guide (arrows 370) is reflected by the hemispherical concavities 456, 458, 460 of the patterned area 452 and, thus, is redirected toward the light guide upper surface 352 and the auxiliary key area 232, as schematically indicated by the arrows 372. In this manner, the patterned area 452 causes an increased amount of light to leave the light guide at a location adjacent and beneath the auxiliary key area 232.

Each of the hemispherical concavities in the patterned areas 430 (e.g., the hemispherical concavities 456, 458, 460 of the patterned area 452, FIG. 2) may, for example, have a diameter between about 40 μm and about 80 μm. The density and pattern of the concavities may, if desired, be varied over the length and/or width of the light guide 350 in order to achieve more uniform light intensity across the key areas 200 of the keypad 190. Higher density patterns (which tend to redirect relatively more light toward the keypad 190) might be used, for example, at locations that are further away from the light sources 322, 324.

With further reference to FIG. 2, a light reflecting layer 470 may optionally be provided beneath the light guide 350, as shown, in order to reduce the amount of light that otherwise might escape the light guide 350 through the lower surface 354.

It is noted that the various features shown in FIG. 2 are not necessarily drawn to scale. The illustrated relative size of the hemispherical concavities 456, 458, 460, for example, has been exaggerated to facilitate illustration and explanation.

The patterned areas 430 may be formed in the lower surface 354 of the light guide 350 using, for example, a hot-press methodology. To accomplish this, a pattern mold having appropriate patterns in desired areas may first be heated and then pressed against the lower surface 354 of the light guide material. In the case where the patterned areas are made up of hemispherical concavities (e.g., the concavities 456, 458, 460 shown in FIG. 2), for example, the pattern mold would include a corresponding pattern of protruding (convex) hemispheres in areas corresponding to each of the patterned areas 430 on the light guide 350.

Figure 4:
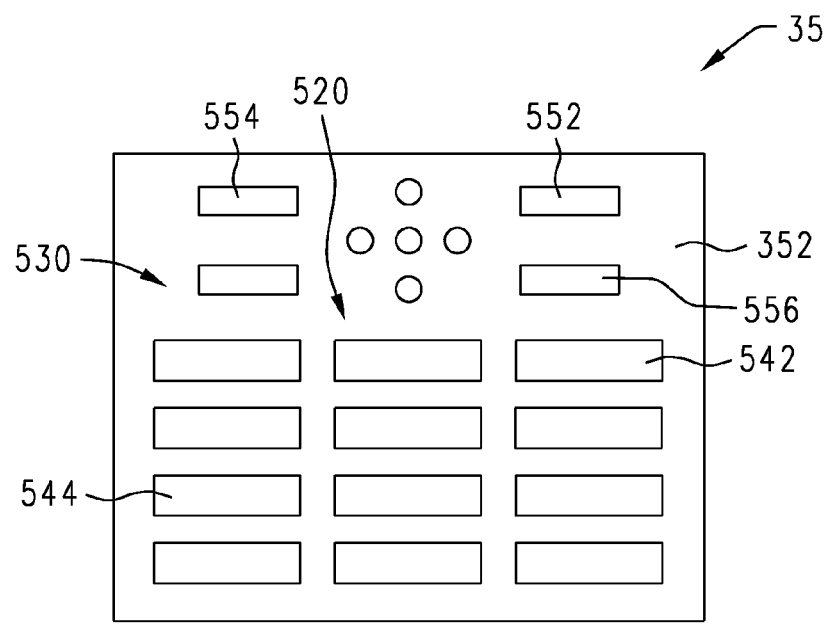
FIG. 4 is a top plan view of the exemplary light guide of FIG. 3.

With reference to FIG. 4, the light guide 350 may generally be provided with a capacitive sensing grid 520 formed on the upper surface 352 of the light guide 350. The capacitive sensing grid 520 may be made up of a plurality of capacitive sensing areas 530, including the individual capacitive sensing areas 542, 544, 552, 554 and 556, formed on the upper surface 352 of the light guide 350, as schematically illustrated in FIG. 4. One of the capacitive sensing areas 530 may generally be located beneath each of the keypad areas 210 and auxiliary key areas 230 of the keypad 190, FIG. 1. With further reference to FIGS. 1 and 4, it can be appreciated that the individual capacitive sensing areas 542 and 544, for example, will underlie the keypad areas 212 and 214, respectively and that the individual capacitive sensing areas 552, 554 and 556 will underlie the auxiliary key areas 232, 234 and 236, respectively. In this manner, the presence of a user's finger or thumb on or above one of the key areas 200 can be determined, thus allowing a user to selectively enter data and/or commands during operation of the mobile telephone device 100.

Figure 5:
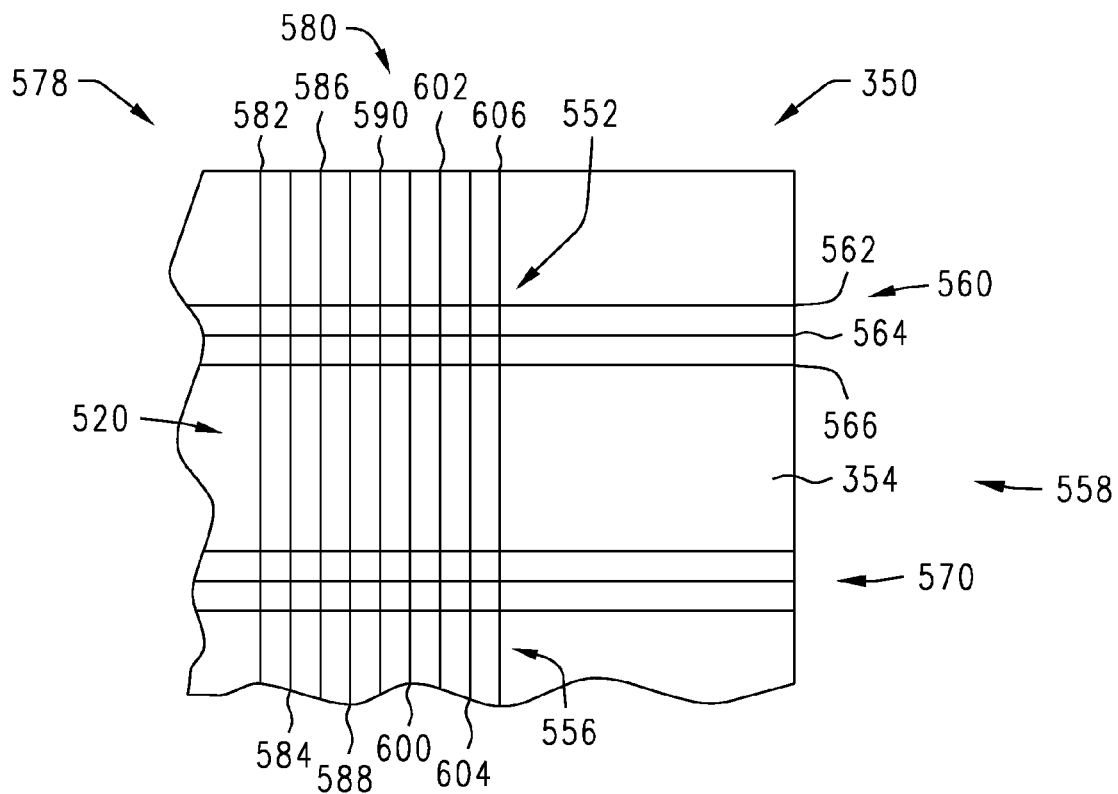
FIG. 5 is an enlarged top plan view of a portion of the exemplary light guide of FIGS. 3 and 4.

Referring to FIG. 5, the capacitive sensing grid 520 may, for example, include a plurality of electrical conductors, or traces 556, formed directly on the upper surface 352 of the light guide 350, as schematically illustrated in FIG. 5. The traces 556 may be arranged in a plurality of rows 558 (e.g., the rows 560, 570 illustrated in FIG. 5) and columns 578 (e.g., the column 580 illustrated in FIG. 5). Each of the rows 558 may include a plurality of the traces 556. The row 560, for example, may include the three traces 562, 564, 566. Likewise, each of the columns 578 may include a plurality of traces. The column 580, for example, may include the nine traces 582, 584, 586, 588, 590, 600, 602, 604 and 606, as shown.

FIG. 2 illustrates, in further detail, the auxiliary key area 232 and the corresponding underlying capacitive sensing area 552. As can be seen from FIG. 2, the capacitive sensing area 552 includes the traces in row 560 (i.e., the individual traces 562, 564 and 566) and the perpendicular traces in column 580 (only the individual trace 602 is visible in the view of FIG. 2). The light guide 350, including the capacitive sensing grid 520, may have a thickness "A" of from about 0.05 mm to about 3.0 mm. As noted previously, the various features shown in FIG. 2 are not necessarily drawn to scale. The illustrated relative thicknesses of the traces 562, 564, 566 and 602, for example, has been exaggerated to facilitate illustration and explanation.

The rows 558 and columns 578 of traces described above may represent the sense and drive electrodes of a mutual capacitive sensing system. In this manner, one of the capacitive sensing areas 530, FIG. 4, may be formed at each location where a row and column of traces overlap. With reference to FIG. 5, it can be seen, for example, that the capacitive sensing area 552 is formed at the location where the row 560 and column 580 meet and that the capacitive sensing area 556 is formed at the location where the row 570 and column 580 meet. The traces of the rows and columns may, for example, be formed substantially in a single plane, with insulating materials located between them where they cross, in a known manner.

It is noted that the configuration of the capacitive sensing grid 520, including the specific number of traces in the rows and columns, is set forth above for illustrative exemplary purposes only. There could, alternatively, be a different number (including one) of traces in each of the rows and columns, this number being driven, at least in part, by the location, size and shape of the overlying key areas of the keypad 190. The arrangement and location of the traces also may be altered in any desired manner, depending, for example, on the layout of the keypad. Although not specifically detailed herein, the mobile telephone device 100 may also include other components associated with the capacitive sensing system, as will be readily recognized by a person skilled in the art (e.g., one or more controllers and various conductors connecting the capacitive sensing grid 520 to the one or more controllers). Mutual capacitive sensing systems are well-known in the art, as exemplified with reference to U.S. Patent Application Publication No. 2009/0194344 for SINGLE LAYER MUTUAL CAPACITANCE SENSING SYSTEMS, DEVICE, COMPONENTS AND METHODS of Harley et al., which is hereby specifically incorporated by reference for all that is disclosed therein.

It is noted that, although a mutual capacitance sensing mechanism is discussed above, the traces 556 may alternatively be configured in different types of capacitive sensing mechanisms. One example of such an alternative configuration is a self capacitive sensing system as is well known in the art. Both self capacitance and mutual capacitance sensing systems are discussed, for example, in U.S. Patent Application Publication No. 2009/0194344, referenced above.

The traces 556 making up the capacitive sensing grid 520 may, for example, be formed from an at least partially optically transparent electrically conductive printed ink, such as Indium Tin Oxide (ITO). In this manner, light from the light guide 350 is able to substantially pass through the traces and reach the key areas 200 of the keypad 190. The ink may be printed directly on the upper surface 352 of the light guide 350 to form the capacitive sensing grid 520. Alternatively, a portion of the grid may be printed directly on the upper surface 352 and the remainder of the grid may be printed on one or more interleaving transparent insulating layers. A conducting polymer, such as PEDOT, may be used in place of or in addition to the optically transparent electrically conductive ink discussed above. The use of both ITO and PEDOT as conductive traces is known in the art, as exemplified with reference to PCT International Publication No. WO 2009/136178 for CAPACITIVE SENSING APPARATUS of Gourlay, which is hereby specifically incorporated by reference for all that is disclosed therein.

As can be appreciated from the above, the light guide 350 combines the functions of a traditional light guide film (including the optional inclusion of patterned areas to increase the uniformity of light distribution) and a capacitive sensing grid into a single one-piece unit. This is advantageous in that it eliminates the need to provide a separate substrate for the capacitive sensing grid and, thus, allows the overall thickness of the mobile telephone device 100 to be reduced. This also provides advantages in the process of manufacturing the mobile telephone device. Specifically, for example, the need to align a separate light guide and capacitive sensing grid substrate is eliminated, thus simplifying the manufacturing process and reducing the overall tolerance requirements for the device. Further, the number of stock holding items required to be inventoried at or near the manufacturing facility is reduced.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An electronic device comprising:
   a housing defining an interior of said device within said housing and an exterior of said device outside of said housing;
   a keypad comprising a first keypad surface facing said exterior of said device, and an oppositely-disposed second keypad surface facing said interior of said device, said keypad comprising a plurality of user interface key areas;
   a light guide positioned adjacent said second keypad surface, said light guide capable of backlighting said plurality of user interface key areas; and
   a capacitive sensing grid formed on an upper surface of the light guide, which is capable of sensing user input relative to said keypad.

2. The device of claim 1 and further wherein:
   said capacitive sensing grid comprises a plurality of capacitive sensing areas; and
   each of said plurality of capacitive sensing areas is aligned with one of said plurality of predefined user interface key areas.

3. The device of claim 1 and further wherein:
   said light guide comprises a plurality of patterned areas; and
   each of said plurality of patterned areas is aligned with one of said plurality of predefined user interface key areas.

4. The device of claim 1 and further wherein:
   said first keypad surface is substantially planar;
   said second keypad surface is substantially planar and substantially parallel to said first keypad surface;
   said light guide comprises a substantially planar first light guide surface and an oppositely-disposed substantially planar second light guide surface that is substantially parallel to said first light guide surface; and
   said second keypad surface is substantially parallel to and adjacent said first light guide surface.

5. The device of claim 4 and further wherein: said capacitive sensing grid is formed on said first light guide surface.

6. The device of claim 5 and further wherein:
   said capacitive sensing grid comprises a plurality of traces printed directly onto said first light guide surface with an electrically conductive ink.

7. The device of claim 1 and further wherein said device is a mobile telephone device.

8. The device of claim 1 and further wherein:
   each of said plurality of predefined user interface key areas comprises at least one icon indicating one or more functions associated with said key area.

9. In an electronic device, a method comprising:
   backlighting a plurality of user interface key areas in a keypad of said electronic device with a light guide; and
   sensing user input relative to said keypad with a capacitive sensing grid formed on said light guide at each of said plurality of user interface key areas.

10. The method of claim 9 and further wherein:
    said backlighting a plurality of user interface key areas further comprises directing light through said plurality of user interface key areas using a plurality of patterned areas formed in said light guide.

11. The method of claim 10 and further wherein:
    each of said plurality of patterned areas formed in said light guide is aligned with one of said user interface key areas of said keypad.

12. The method of claim 9 and further wherein:
    said backlighting a plurality of user interface key areas further comprises backlighting at least one icon on each of said plurality of predefined user interface key areas, said at least one icon indicating one or more functions associated with said key area.

13. A user input assembly for an electronic device, said user input assembly comprising:
    a keypad comprising a plurality of user interface key areas, a substantially planar first keypad surface and a substantially planar second keypad surface that is substantially parallel to said first keypad surface;
    a light guide comprising a capacitive sensing grid at each of said plurality of user interface key areas, a substantially planar first light guide surface at and a substantially planar second light guide surface that is substantially parallel to said first light guide surface; and
    wherein, said second keypad surface is substantially parallel to and adjacent said first light guide surface.

14. The user input assembly of claim 13 and further wherein:

said capacitive sensing grid comprises a plurality of capacitive sensing areas; and each of said plurality of capacitive sensing areas is aligned with one of said plurality of predefined user interface key areas.

15. The user input assembly of claim 13 and further wherein:

said light guide comprises a plurality of patterned areas; and each of said plurality of patterned areas is aligned with one of said plurality of predefined user interface key areas.

16. The user input assembly of claim 15 and further wherein:

said plurality of patterned areas is formed in said second light guide surface.

17. The user input assembly of claim 13 and further wherein: said capacitive sensing grid is formed on said first light guide surface.

18. The user input assembly of claim 17 and further wherein:

said capacitive sensing grid comprises a plurality of traces printed directly onto said first light guide surface with an electrically conductive ink.

19. The user input assembly of claim 13 and further wherein said user input assembly is assembled within a mobile telephone device.

20. The user input assembly of claim 13 and further wherein:

each of said plurality of predefined user interface key areas comprises at least one icon indicating one or more functions associated with said key area.

* * * * *